United States Patent
Myo et al.

(10) Patent No.: US 9,650,726 B2
(45) Date of Patent: May 16, 2017

(54) METHODS AND APPARATUS FOR DEPOSITION PROCESSES

(75) Inventors: Nyi O. Myo, San Jose, CA (US); Kevin Bautista, San Jose, CA (US); Zhiyuan Ye, Cupertino, CA (US); Schubert S. Chu, San Francisco, CA (US); Yihwan Kim, Milpitas, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 1281 days.

(21) Appl. No.: 13/028,842

(22) Filed: Feb. 16, 2011

(65) Prior Publication Data
US 2011/0209660 A1    Sep. 1, 2011

Related U.S. Application Data

(60) Provisional application No. 61/308,646, filed on Feb. 26, 2010.

(51) Int. Cl.
| | |
|---|---|
| C30B 21/02 | (2006.01) |
| C30B 25/12 | (2006.01) |
| C23C 16/458 | (2006.01) |
| H01L 21/687 | (2006.01) |

(52) U.S. Cl.
CPC .......... C30B 25/12 (2013.01); C23C 16/4586 (2013.01); H01L 21/68735 (2013.01); H01L 21/68742 (2013.01)

(58) Field of Classification Search
USPC .............................. 117/86, 89, 101, 104, 105
See application file for complete search history.

(56) References Cited

U.S. PATENT DOCUMENTS

| | | |
|---|---|---|
| 5,421,957 A | 6/1995 | Carlson et al. |
| 6,444,027 B1 | 9/2002 | Yang et al. |
| 6,652,650 B2 | 11/2003 | Yang et al. |
| 7,648,579 B2 | 1/2010 | Goodman et al. |
| 2004/0144323 A1 | 7/2004 | Kai |
| 2005/0016466 A1 | 1/2005 | Scudder et al. |
| 2005/0193952 A1 | 9/2005 | Goodman et al. |
| 2006/0180076 A1 | 8/2006 | Kanaya et al. |
| 2008/0066684 A1 | 3/2008 | Patalay et al. |
| 2008/0069951 A1 | 3/2008 | Chacin et al. |

FOREIGN PATENT DOCUMENTS

JP    2003-289045 A    10/2003

OTHER PUBLICATIONS

International Search Report and Written Opinion mailed Oct. 27, 2011 for PCT Application No. PCT/US2011/025247.
Search Report for Taiwan Invention Patent Application No. 100106467.

*Primary Examiner* — Robert M Kunemund
(74) *Attorney, Agent, or Firm* — Moser Taboada; Alan Taboada

(57) ABSTRACT

Methods and apparatus for deposition processes are provided herein. In some embodiments, an apparatus may include a substrate support comprising a susceptor plate having a pocket disposed in an upper surface of the susceptor plate and having a lip formed in the upper surface and circumscribing the pocket, the lip configured to support a substrate on the lip; and a plurality of vents extending from the pocket to the upper surface of the susceptor plate to exhaust gases trapped between the backside of the substrate and the pocket when a substrate is disposed on the lip. Methods of utilizing the inventive apparatus for depositing a layer on a substrate are also disclosed.

17 Claims, 8 Drawing Sheets

ETCH GAS

PRESSURIZING GAS

METHODS AND APPARATUS FOR DEPOSITION PROCESSES

CROSS-REFERENCE TO RELATED APPLICATIONS

This application claims benefit of U.S. provisional patent application Ser. No. 61/308,646, filed Feb. 26, 2010, which is herein incorporated by reference.

FIELD

Embodiments of the present invention generally relate to processing equipment and methods of using the same.

BACKGROUND

Susceptor plates can be used to support a substrate during processes, such as epitaxial deposition, etching, thermal oxidation, or the like. In some processes, a susceptor plate may be configured with a central recess, or pocket, and support ledge to support the substrate being processed proximate an outer edge of the substrate. The pocket may serve to assist in the control of substrate temperature by reflecting energy radiated from a backside of the substrate back towards the substrate. The pocket may also serve as a support surface for lift pins while in a retracted position during processing.

One process where such an apparatus is used is a selective epitaxial deposition that utilizes alternating deposition and etch processes. The alternating deposition and etch processes of the selective epitaxial deposition must be carried out at substantially different pressures. For example, the deposition process may be carried out at a pressure of about 10 Torr and the etch process may be carried out at a pressure of about 300 Torr. The pressure differential requires repeated alteration of the chamber pressure, which undesirably slows process throughput. In addition, the inventors have discovered that the pressure must be changed slowly to avoid movement of the substrate on the susceptor plate due to pressure differences between the frontside and backside of the substrate. Unfortunately, the slow change of the pressure between deposition and etch processes further slows process throughput.

The inventors have also discovered that the lift pins can undesirably affect the reflection of radiative energy from the backside of the substrate. As such, the existing configuration of lift pins in the susceptor pocket can result in undesirable non-uniform temperature profiles on the substrate.

Accordingly, the inventors have devised novel susceptor designs, process apparatus, and deposition processes to overcome the above-mentioned limitations.

SUMMARY

Methods and apparatus for deposition processes are provided herein. In some embodiments, an apparatus may include a substrate support including a susceptor plate having a pocket disposed in an upper surface of the susceptor plate and having a lip formed in the upper surface and circumscribing the pocket, the lip configured to support a substrate on the lip; and a plurality of vents extending from the pocket to the upper surface of the susceptor plate to exhaust gases trapped between the backside of the substrate and the pocket when a substrate is disposed on the lip.

In some embodiments, an apparatus may include a susceptor ring having an inner edge to support a substrate on the inner edge; a central support having a supporting member radially extending from the central support to support the susceptor ring on the supporting member, the supporting member having a plurality of lift pin supporting surfaces on a susceptor ring facing side of the supporting member, each lift pin supporting surface having a hole disposed through each lift pin supporting surface between the susceptor ring facing side and a backside of the supporting member; and a plurality of lift pins, each lift pin moveably disposed through the hole in each lift pin supporting surface and supported by the lift pin supporting surface when the lift pin is in a retracted position.

In some embodiments, a substrate support may include a susceptor plate having a pocket disposed in an upper surface of the susceptor plate and having a lip formed in the upper surface and circumscribing the pocket, the lip configured to support a substrate on the lip; and a plurality of vents extending from the pocket to a backside of the susceptor plate to exhaust gases trapped between the backside of the substrate and the pocket when a substrate is present, wherein the vents are configured such that there is no line of sight from the pocket to the backside of the susceptor plate in a direction parallel to a central axis of the susceptor plate.

In some embodiments, an apparatus may include a process chamber having a substrate support as described in any of the embodiments disclosed herein disposed in the process chamber, wherein the process chamber has an inner volume comprising a first volume disposed above the substrate support and a second volume disposed below the substrate support; a first gas inlet disposed above the substrate support for providing a process gas to the first volume to process a substrate disposed on the substrate support; and a second gas inlet disposed below the surface of the substrate support for providing a pressurizing gas to the second volume to facilitate raising the chamber pressure to a desired chamber pressure at a desired pressure ramping rate.

In some embodiments, the apparatus may further include a pressure control valve coupled between a gas panel for supplying the process and pressurizing gases and the first and second gas inlets, wherein the pressure control valve regulates the flow of the process and pressurizing gases such that the chamber pressure does not substantially exceed the desired chamber pressure during ramping the pressure at the desired pressure ramping rate.

In some embodiments, a method of selectively depositing an epitaxial layer on a substrate may include providing a process chamber having an inner volume with a substrate support disposed in the inner volume with a substrate disposed on the substrate support, wherein the inner volume comprises a first inner volume above the substrate support and a second inner volume below an upper surface of the substrate support and wherein the substrate has a first surface for depositing an epitaxial layer on the first surface and a second surface; flowing a deposition gas to deposit the epitaxial layer on the first surface of the substrate at a first chamber pressure; flowing an etching gas into the first volume to selectively etch a second layer deposited on the second surface; and flowing a pressurizing gas into the second volume simultaneously with flowing the etching gas into the first volume to raise the chamber pressure to a second chamber pressure greater than the first chamber pressure at a desired pressure ramping rate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
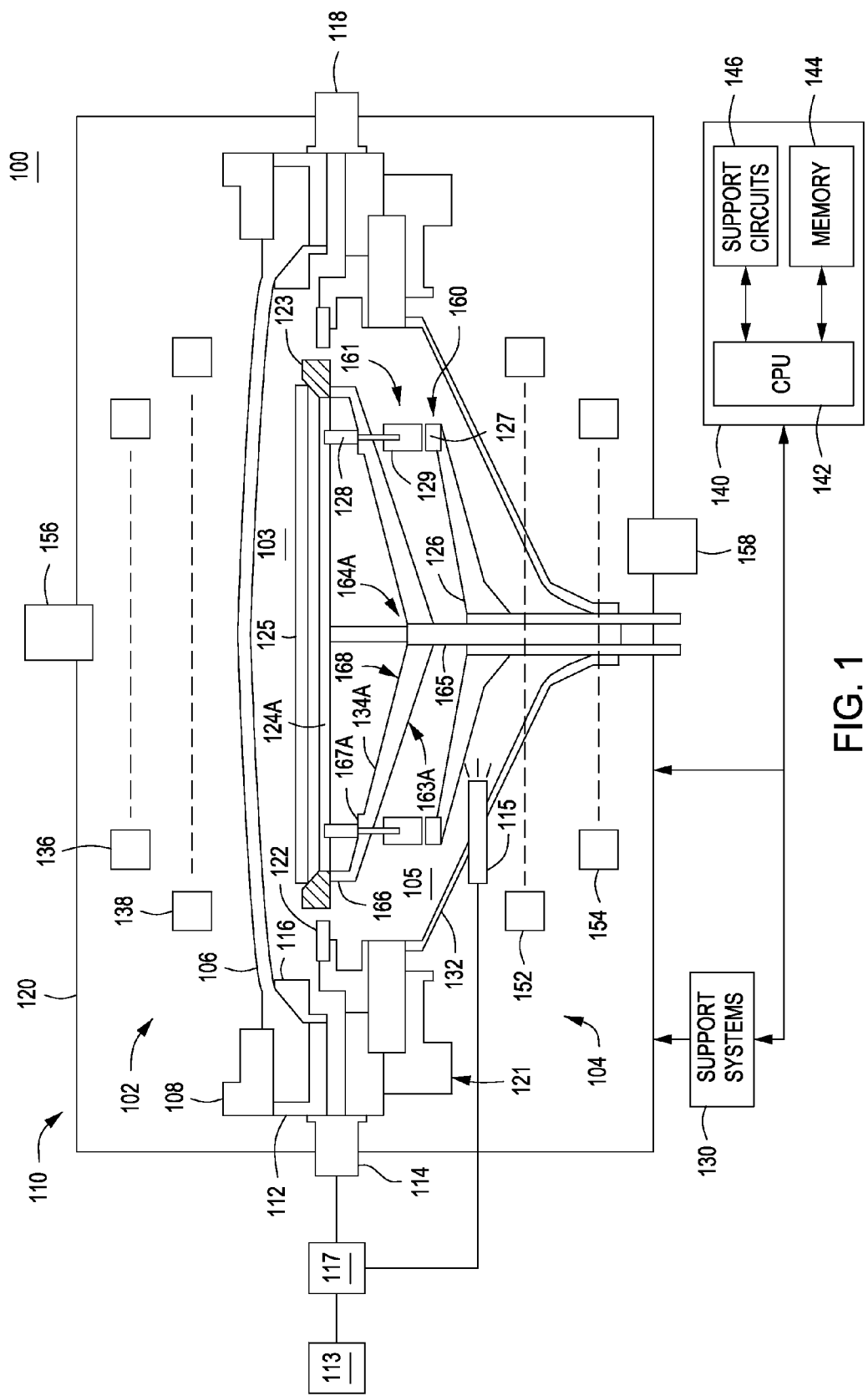
FIG. 1 depicts a schematic side view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for deposition processes are disclosed herein. The inventive apparatus may include susceptor designs and/or additional apparatus as disclosed herein to advantageously provide rapid pressure equilibration between the frontside and backside of a substrate during processing, such as when switching between deposition and etch processes during a selective epitaxial deposition process. The inventive apparatus may further advantageously provide improved temperature uniformity across the substrate. Inventive methods are also disclosed, and may be utilized with the inventive apparatus, to rapidly ramp pressure, thereby advantageously improving process throughput. The inventive methods may further advantageously maintain selectivity, growth rate, and layer quality during deposition.

FIG. 1 depicts a schematic side view of a process chamber 100 in accordance with some embodiments of the present invention. The process chamber 100 may be modified from a commercially available process chamber, such as the RP EPI® reactor, available from Applied Materials, Inc. of Santa Clara, Calif., or any suitable semiconductor process chamber adapted for performing epitaxial deposition processes. Alternatively, the process chamber 100 may be adapted for performing at least one of deposition processes, etch processes, plasma enhanced deposition and/or etch processes, and thermal processes, among other processes performed in the manufacture of integrated semiconductor devices and circuits. Specifically, such processes may include, but are not limited to, processes where rapid pressure changes are utilized during processing.

In some embodiments, the process chamber 100 may be adapted for performing epitaxial deposition processes as discussed above and illustratively comprises a chamber body 110, support systems 130, and a controller 140. The chamber body 110 generally includes an upper portion 102 having a first inner volume 103, a lower portion 104 having a second inner volume 105, and an enclosure 120.

The upper portion 102 is disposed on the lower portion 104 and includes a lid 106, a clamp ring 108, a liner 116, a baseplate 112, one or more upper lamps 136 and one or more lower lamps 138, and an upper pyrometer 156. In one embodiment, the lid 106 has a dome-like form factor, however, lids having other form factors (e.g., flat or reverse-curve lids) are also contemplated. The lower portion 104 is coupled to a first gas inlet port 114 and an exhaust port 118 and comprises a baseplate assembly 121, a lower dome 132, a substrate support $124_A$, a pre-heat ring 122, one or more upper lamps 152 and one or more lower lamps 154, and a lower pyrometer 158. Although the term "ring" is used to describe certain components of the process chamber, such as the pre-heat ring 122 or a susceptor ring 123 (discussed below), it is contemplated that the shape of these components need not be circular and may include any shape, including but not limited to, rectangles, polygons, ovals, and the like.

Figure 4A:
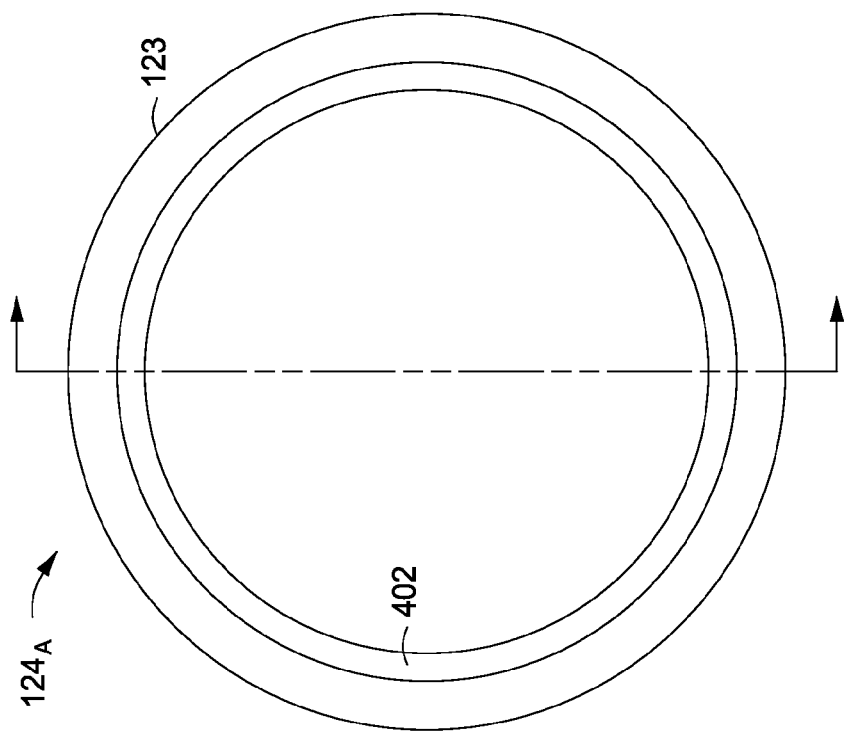
FIGS. 4A-C depict schematic side views of various embodiments of a substrate support in accordance with some embodiments of the present invention.
Figure 4A:
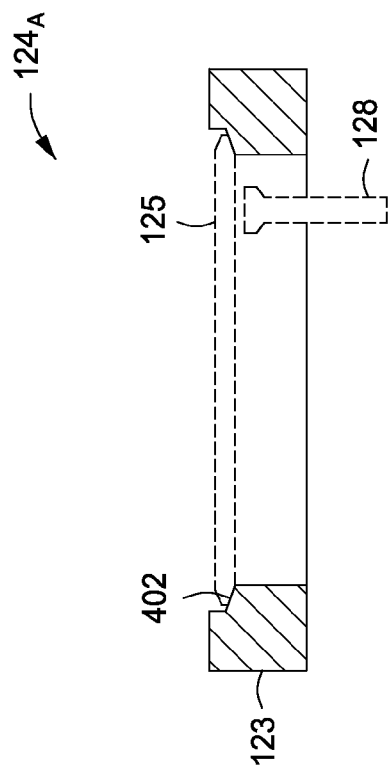

In some embodiments, the substrate support $124_A$ generally includes a susceptor ring 123 supported, a substrate support assembly $164_A$ for supporting the susceptor ring 123 thereon, and a substrate lift assembly 160. The susceptor ring 123 is illustrated in a schematic side view in FIG. 1 and in side and top views in FIG. 4A. The susceptor ring 123 has an inner edge 402 for supporting the substrate 125 thereon. The susceptor ring 123 may comprises at least one of silicon carbide coated graphite, solid silicon carbide, solid sintered silicon carbon, or solid metal-free sintered silicon carbide.

The inventors have discovered that the use of a susceptor ring design may advantageously limit the effects of lift pin patterns caused by lift pins resting against a pocket of a conventional susceptor during processing. Further, the susceptor ring design may provide improved uniformity in substrate heating as the backside of the substrate is in direct view of, for example, lower lamps 154 of process chamber 100 with no susceptor plate disposed between the lower lamps 154 and the backside of the substrate. Further, the susceptor ring design eliminates substrate sliding, movement, or the like that may be caused by a pressure differential between gases trapped between the support surface of a conventional susceptor and the backside of the substrate, for example, when rapidly decreasing chamber pressure.

The substrate support assembly $164_A$ generally includes a central support 165 having a supporting member $163_A$ radially extending therefrom for supporting the susceptor ring 123 thereon. The supporting member $163_A$ includes a plurality of lift pin supporting surfaces $167_A$ on a susceptor ring facing side 168 of the supporting member $163_A$. Each lift pin supporting surface $167_A$ has a lift pin hole $169_A$ disposed therethrough between the susceptor ring facing side 168 and a backside 170 of the supporting member $163_A$. Each lift pin hole $169_A$ may be configured to have a lift pin 128 moveably disposed therethrough. Each lift pin supporting surface $167_A$ may be configured to support a lift pin 128 when the lift pin is in a retracted position.

In some embodiments, the supporting member $163_A$ further comprises a plurality of support arms $134_A$. Each support arm $134_A$ may have a lift pin supporting surface $167_A$ disposed thereon and a lift pin hole $169_A$ disposed therethrough. In some embodiments, each support arm $134_A$ may further include a support pin 166 for coupling the support arm to the susceptor ring 123. In some embodiments, the number of support arms $134_A$ is three and the number of lift pins 128 is three.

Alternatively, and not shown, the supporting member may a single-piece conical member. The conical member may further include a plurality of vents disposed therethrough for fluidly coupling the backside of the substrate 125 to the second inner volume 105 of the process chamber 100. In such embodiments, the conical member may be absorptive or transmissive of radiant energy provided during processing, to control the temperature of the substrate as desired.

The substrate lift assembly 160 may be disposed about the central support 165 and axially moveable therealong. The substrate lift assembly 160 comprises a substrate lift shaft 126 and a plurality of lift pin modules 161 selectively resting on respective pads 127 of the substrate lift shaft 126. In some embodiments, a lift pin module 161 comprises an optional base 129 where the lift pin 128 coupled to the base 129. Alternatively, a bottom portion of the lift pin 128 may rest directly on the pads 127. In addition, other mechanisms for raising and lowering the lift pins 128 may be utilized.

Each lift pin 128 is movably disposed through a lift pin hole $169_A$ in each support arm $134_A$ and can rest on the lift pin supporting surface $167_A$ when the lift pin 128 is in a retracted position, for example, such as when the substrate 125 has been lowered onto the susceptor ring 123. In operation, the substrate lift shaft 126 is moved to engage the lift pins 128. When engaged, the lift pins 128 may raise the substrate 125 above the substrate support 124 or lower the substrate 125 onto the susceptor ring 123.

The substrate support $124_A$ is one embodiment of an inventive substrate support disclosed herein. However, additional embodiments of the a substrate support may be utilized with the process chamber 100, for example, a substrate support $124_B$ depicted in-situ in the process chamber 100 in FIG. 2 and in schematic side and top views in FIG. 4B, or a substrate support $124_C$ depicted in-situ in the process chamber 100 in FIG. 3 and in schematic side and top views in FIG. 4C.

Figure 2:
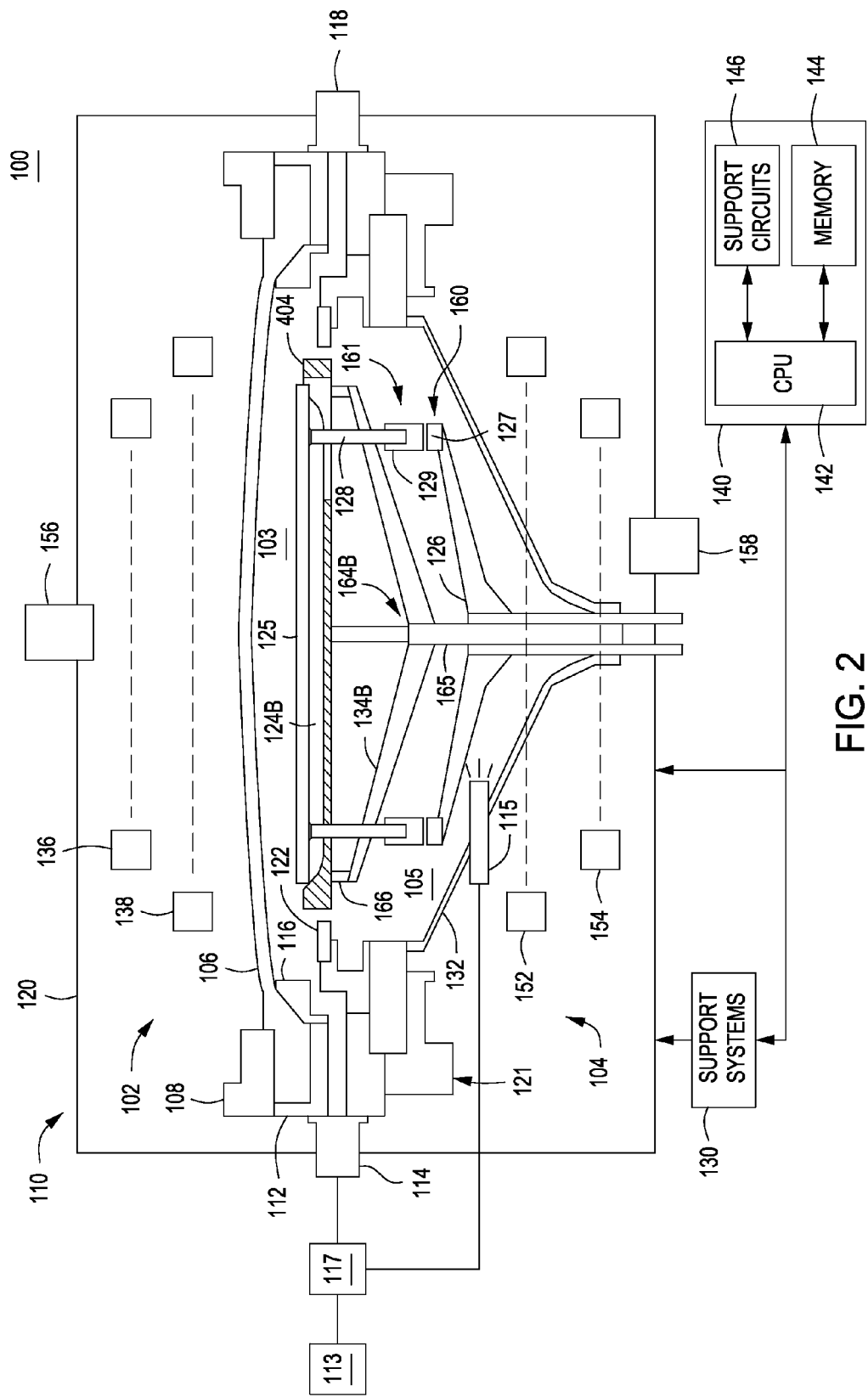
FIG. 2 depicts a schematic side view of a process chamber in accordance with some embodiments of the present invention.
Figure 4B:
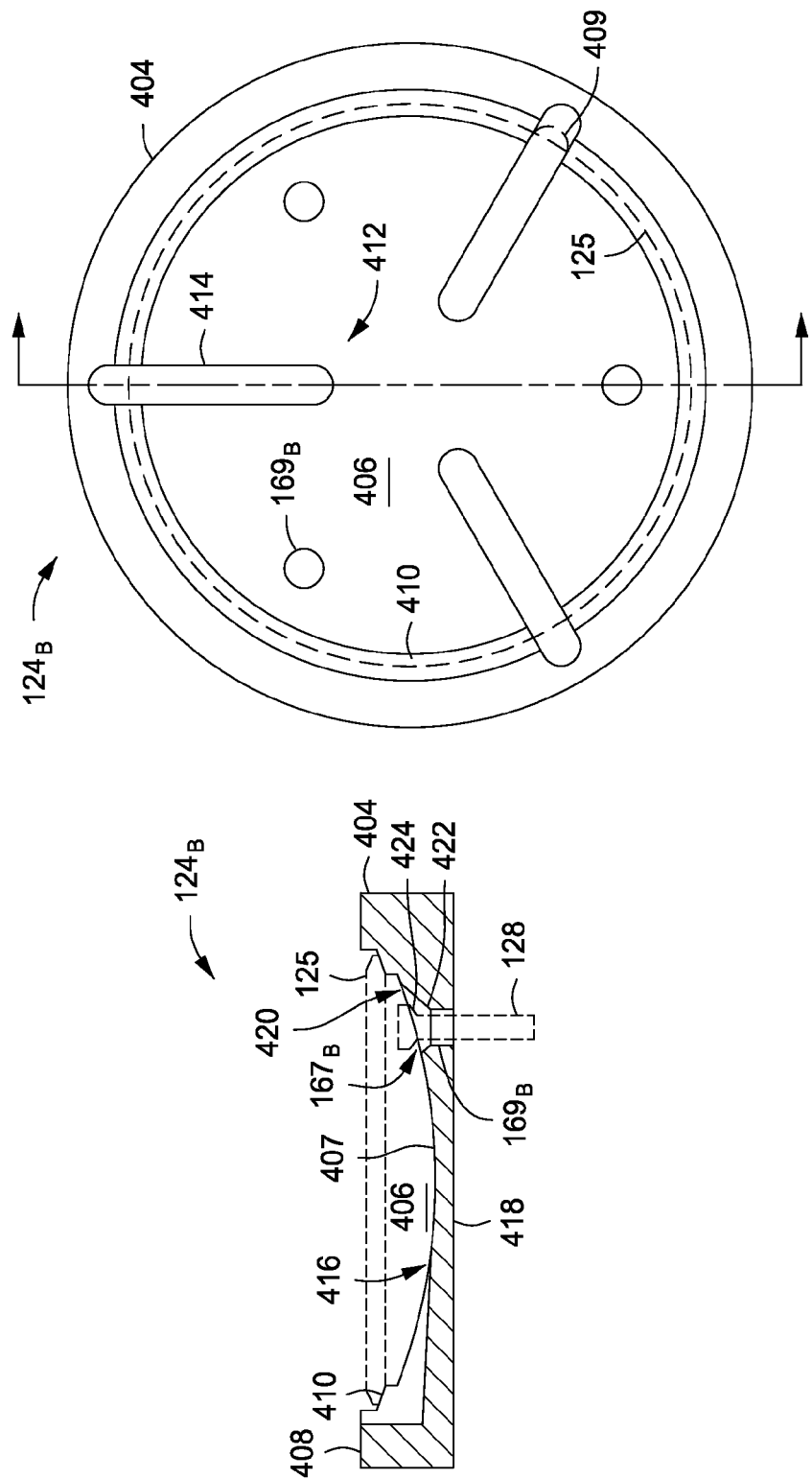

The substrate support $124_B$ depicted in FIGS. 2 and 4B may include a susceptor plate 404 having a pocket 406 disposed in an upper surface 408 thereof, a substrate support assembly $164_B$ for supporting the susceptor plate 404 thereon, and the substrate lift assembly 160 as discussed above.

The susceptor plate 404 may comprise similar materials as the susceptor ring 123 discussed above. The susceptor plate 404 further comprises a lip 410 formed in the upper surface 408 and circumscribing the pocket 406. The lip 410 may be configured for resting, or supporting, the substrate 125 thereon as shown. A surface 407 of the pocket 406 may be concave (as shown) or any suitable shape to absorb and reflect radiant energy for controlled and uniform heating of the substrate 125.

The substrate support $124_B$ includes a plurality of vents 412 extending from the pocket 406 to the upper surface 408 of the susceptor plate 404 to exhaust gases trapped in the pocket 406 to the first inner volume 103 of the upper portion 102 of the process chamber. As discussed above, without vents, gases may become trapped, for example, when the substrate 125 is initially positioned on the substrate support $124_B$, during processing, or the like. If the gases remained trapped, for example, during a rapid pressure decrease in chamber pressure, the trapped gases may expand against the reduced chamber pressure causing the substrate 125 to jump, shift, or otherwise move from its location on the substrate support $124_B$.

In some embodiments, one or more of the vents 412 may be a groove 414 (as shown in FIG. 4B). Each groove 414 may extend radially from an inner portion 416 of the pocket 406 to a point beyond the lip 410 of the susceptor plate 404 to facilitate the exhaust of gases from the pocket 406 to the upper surface 408 of the susceptor plate 404. In some embodiments, one or more the vents 412 may be a groove radially extending from an inner portion 416 of the pocket to a portion of the lip 410 of the susceptor plate 404 that lies radially beyond where an edge of the substrate 125 would sit when the substrate 125 is disposed on the lip 410 (as shown in dotted line at 409 in FIG. 4B). Each groove may be cut to any suitable depth and/or length, and the number and/or spacing between grooves may be selected to enact rapid exhaust of gases from the pocket 406. For example, the grooves may extend completely through the susceptor plate 404 (as shown in FIG. 2), or the grooves may extend only partially through the susceptor plate 404 (as shown in FIG. 4B).

In some embodiments, one or more of the vents 412 may be a hole disposed proximate the lip 410 and having a diameter such that the hole extends radially beyond the lip 410 into the upper surface 408 of the susceptor plate 404 and into the pocket 406. Each hole may be machined to any suitable depth and/or diameter, and the number and/or spacing between holes may be selected to enable rapid exhaust of gases from the pocket 406.

The substrate support assembly $164_B$ generally includes the central support 165 having a supporting member $163_B$ radially extending therefrom for supporting the susceptor plate 404 thereon. The supporting member $163_B$ generally may differ from the supporting member $163_A$ in that supporting member $163_B$ does not include lift pin supporting surfaces for supporting each lift pin 128 when the lift pin is in a retracted position. In some embodiments, the supporting member $163_B$ further comprises a plurality of support arms $134_B$. In some embodiments, each support arm $134_B$ may further include the support pin 166 for coupling the support arm to the susceptor plate 404. In some embodiments, three support arms $134_B$ are provided, although greater numbers may be utilized as well.

The substrate support $124_B$ further includes a plurality of lift pin holes $169_B$ disposed in the susceptor plate 404 between the pocket 406 and a backside 418 of the susceptor plate 404. The substrate support $124_B$ further includes a plurality of lift pins 128, each lift pin 128 configured to be moveably disposed through each lift pin hole $169_B$. The substrate support $124_B$ further includes a plurality of lift pin supporting surfaces $167_B$, each lift pin supporting surface disposed on a pocket facing side 420 of each lift pin hole and configured to support a lift pin 128 when the lift pin is in a retracted position.

Each lift pin supporting surface $167_B$ may be configured to match the profile of each lift pin 128, for example, to prevent the lift pin 128 from falling through the lift pin hole $169_B$ and/or make an upper portion (e.g., head) of each lift pin 128 substantially flush with the surface 407 of the pocket 406 to minimize interference with, for example, the absorption and reflection of radiant energy from the surface 407 of the pocket 406. For example, in some embodiments (illustrated in FIG. 4B), each lift pin supporting surface $167_B$ may include a conical surface 422 that matches the profile of a seating surface 424 of the lift pins 128.

The substrate support $124_B$ further includes the substrate lift assembly 160 disposed about the central support 165 and axially moveable therealong for engaging the lift pins 128 to raise and lower the substrate 125 with respect to the substrate support $124_B$. Embodiments of the substrate lift assembly 160 have been discussed in detail above.

Figure 3:
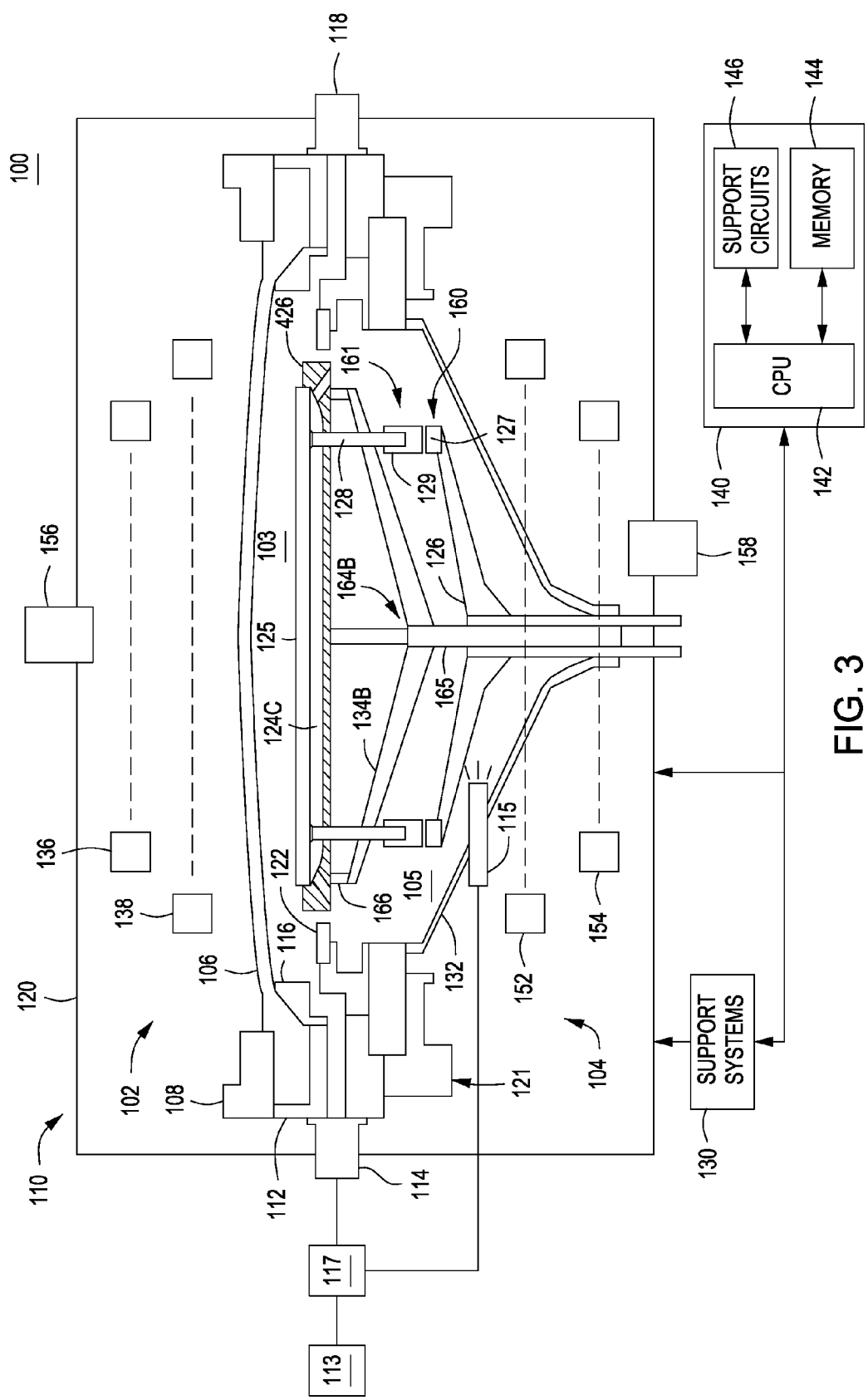
FIG. 3 depicts a schematic side view of a process chamber in accordance with some embodiments of the present invention.
Figure 4C:
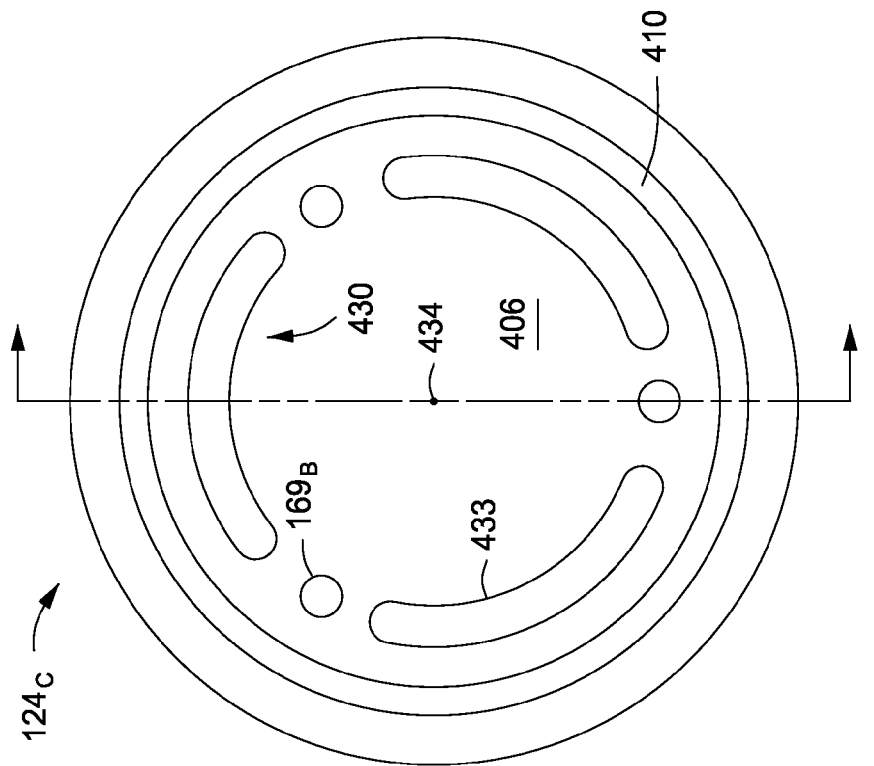
Figure 4C:
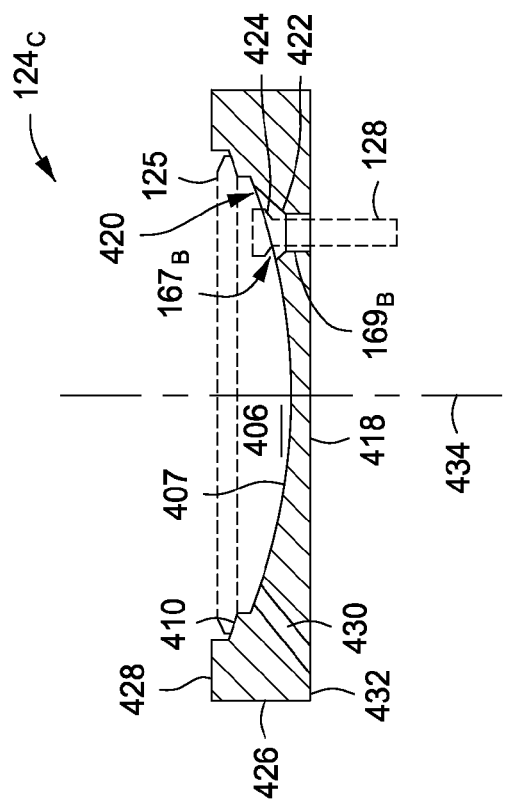

A substrate support $124_C$ in accordance with some embodiments of the present invention is depicted in-situ in the process chamber 100 in FIG. 3 and in schematic side and top views in FIG. 4C. The substrate support $124_C$ includes a susceptor plate 426 having the pocket 406 disposed in an upper surface 428 thereof, the substrate support assembly $164_B$ for supporting the susceptor plate 426 thereon, and the substrate lift assembly 160 as discussed above. The substrate support $124_C$ may be substantially similar to the substrate support $124_B$ with the exception of the susceptor plate 426, as discussed below.

The susceptor plate 426 may comprise similar materials as the susceptor ring 123 and susceptor plate 404 as discussed above. The susceptor plate 426 further comprises a lip 410 formed in the upper surface 428 and circumscribing the pocket 406. The lip 410 may be configured for resting, or supporting, the substrate 125 thereon as shown. The surface 407 of the pocket 406 may be concave (as shown) or any suitable shape to absorb and reflect radiant energy for controlled and uniform heating of the substrate 125.

The substrate support $124_C$ includes a plurality of vents 430 disposed through the susceptor plate 426. The vents 430 extend from the pocket 406 to a backside 432 of the susceptor plate 426 to facilitate exhaust of gases trapped in the pocket 406 when a substrate is present. The vents 430 are configured such that there is no vertical line of sight from the pocket 406 to the backside 432 of the susceptor plate 426 in a direction parallel to a central axis 434 of the susceptor plate 426. The inventors have discovered that having no direct line of sight to the backside 432 of the susceptor plate 426 advantageously limits radiant energy from escaping (instead of reflecting) from the pocket 406. In some embodiments, each vent 430 is a slot 433 disposed proximate the peripheral edge of the pocket and running circumferentially along the outer edge of the pocket.

Other components of the substrate support $124_C$, for example, such as substrate support assembly $124_B$, substrate lift assembly 160, lift pins 128, and the like are substantially similar to those described above for substrate support $124_B$.

Returning to the process chamber 100, and during processing, a substrate 125 is disposed on the substrate support 124. The lamps 136, 138, 152, and 154 are sources of infrared (IR) radiation (i.e., heat) and, in operation, generate a pre-determined temperature distribution across the substrate 125. In some embodiments, the lid 106, the clamp ring 116, and the lower dome 132 are formed from quartz; however, other IR-transparent and process compatible materials may also be used to form these components.

The process chamber 100 further includes a gas panel 113 for supplying process gases to first and second inner volumes 103, 105 of the process chamber 100. For example, the gas panel 113 may provide process gases, such as deposition gases, etchants, or the like, and/or other gases such as carrier gases, gases for dilution, gases for chamber pressurization, or the like. The gas panel 113 provides gases to the first gas inlet port 114 and a second gas inlet port 115 coupled to the process chamber 100 at the lower dome 132. The coupling point of the second gas inlet port 115 (e.g., at the lower dome 132) is merely exemplary, and any suitable coupling point which allows the second gas inlet port 115 to provide gases to the second inner volume 105 may be used.

Generally, the first gas inlet port 114 provides a process gas to the first inner volume 103 to process the substrate 125 disposed on any of the embodiments of a substrate support 124 discussed above. The second gas inlet port 115 provides a pressurizing gas to the second inner volume 105 to facilitate raising the chamber pressure to a desired chamber pressure at a desired pressure ramping rate. In some embodiments, the desired chamber pressure ranges from about 30 to about 600 Torr. In some embodiments, the desired pressure ramping rate ranges from about 30 to about 150 Torr/sec.

In some embodiments, when increasing the chamber pressure during the etch portion of a selective epitaxial deposition process, a process gas including an etchant gas can be flowed into the first inner volume 103 via the first gas inlet port 114. Simultaneously, a pressurizing gas may be flowed into the second inner volume 105 via the second gas inlet port 115 to facilitate raising the chamber pressure to the desired pressure for the etch portion of the selective deposition process. The inventors have discovered that by flowing the pressurizing gas via the second gas inlet port 115 that quality and selectivity of the deposited film is maintained while process throughput is improved.

In some embodiments, the process chamber 100 includes a pressure control valve 117 coupled between the gas panel 113 for supplying the process and pressurizing gases and the first and second gas inlet ports 114, 115. The pressure control valve may regulate the flow of the process and pressurizing gases such that the chamber pressure does not substantially exceed the desired chamber pressure during ramping the pressure at the desired pressure ramping rate (e.g., the chamber pressure does not exceed the desired chamber pressure by more than about 10%, or by about 3% to about 5%.).

The support systems 130 include components used to execute and monitor pre-determined processes (e.g., growing epitaxial silicon films) in the process chamber 100. Such components generally include various sub-systems (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 generally comprises a central processing unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

Figure 5:
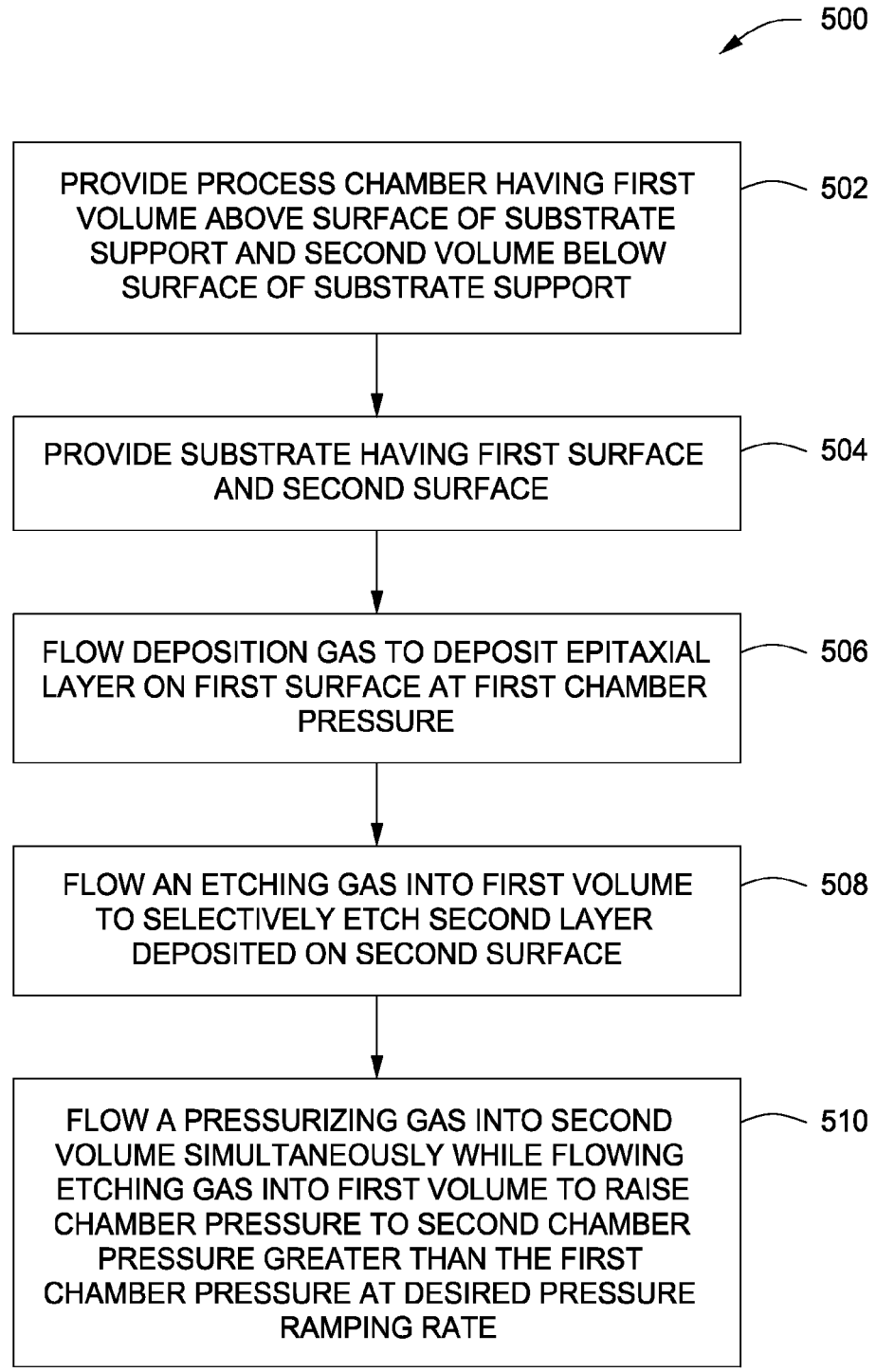
FIG. 5 depicts a flow chart for a method of selectively depositing an epitaxial layer on a substrate in accordance with some embodiments of the present invention.

FIG. 5 depicts a flow chart for a method 500 of selectively depositing an epitaxial layer on a substrate in accordance with some embodiments of the present invention. The inventive method may be utilized with any of the embodiments of the process chamber 100 and the substrate support 124 discussed above. The inventive method, however, will be discussed below in accordance with the embodiments of a substrate support 124A illustrated in FIGS. 1 and 4A. Further, FIG. 6 depicts the stages of selectively depositing an epitaxial layer on a substrate in accordance with the method of FIG. 5.

Figure 6A:
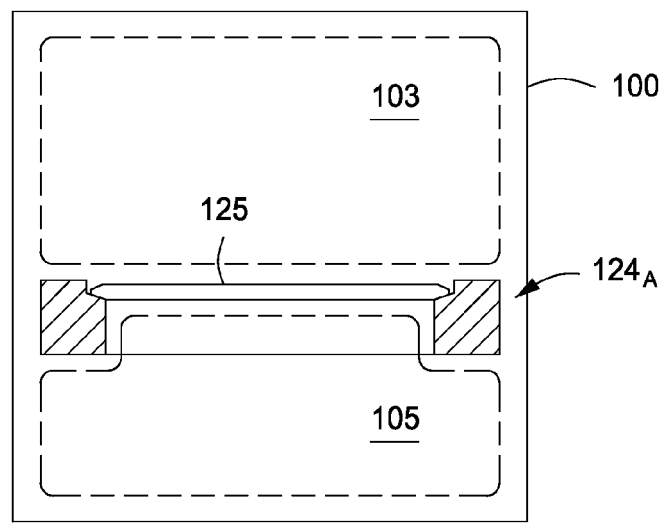
FIG. 6 depicts the stages of selectively depositing an epitaxial layer on a substrate in accordance with the method of FIG. 5.

The method 500 begins at 502 by providing the process chamber 100 having an inner volume with the substrate support $124_A$ disposed therein with the substrate 125 disposed thereon, wherein the inner volume comprising the first inner volume 103 above the substrate support $124_A$ and a second inner volume 105 below the susceptor ring 123 and the backside of the substrate 125. A simplified schematic illustration of the process chamber 100 and substrate support $124_A$ is depicted in FIG. 6A.

Figure 6B:
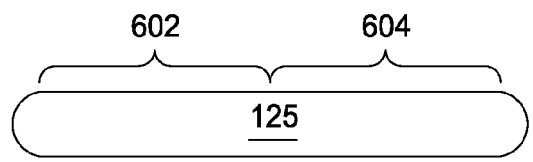
Figure 6C:
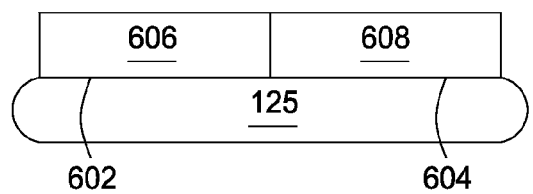

At 504, the substrate 125 is provided having a first surface 602 for depositing an epitaxial layer thereon and an opposing second surface 604 (illustrated in FIG. 6B). The substrate 125 may comprise a suitable material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. Further, the substrate 125 may comprise multiple layers, or include, for example, partially fabricated devices such as transistors, flash memory devices, and the like.

At 506, a deposition gas is flowed to deposit an epitaxial layer 606 (illustrated in FIG. 6C) on the first surface 602 of the substrate 125 at a first chamber pressure. In some embodiments, the first chamber pressure ranges from about 0.1 to about 100 Torr. In some embodiments, the deposition gas comprises at least one of silane ($SiH_4$), disilane ($Si_2H_6$), methylsilane ($H_3CSiH_3$) or the like. In some embodiments, the epitaxial layer comprises silicon and carbon.

During the deposition process at 506, a second layer 608 may be formed on the second surface 604. The second layer 608 may be similar in chemical composition to the epitaxial layer 606, but different in chemical structure. For example, the second layer 608 may be non-crystalline, poly-crystalline, amorphous, or any suitable crystalline or non-crystalline structure that differs from the epitaxial layer 606 that may more susceptible to a selective etch process as discussed below.

At 508, an etching gas is flowed into the first inner volume 103 to selectively etch the second layer 608 deposited on the second surface 604. For example, the etching gas may be flowed into the first inner volume 103 via the first gas inlet port 114 as discussed above. In some embodiments, the etching gas comprises at least one of hydrogen chloride (HCl), chlorine ($Cl_2$), germane ($GeH_4$), germanium chloride ($GeCl_4$), silicon tetrachloride ($SiCl_4$), carbon tetrachloride ($CCL_4$), or the like.

At 510, a pressurizing gas is flowed into the second inner volume 105 simultaneously with flowing the etching gas into the first inner volume 103 to raise the chamber pressure to a second chamber pressure greater than the first chamber pressure at a desired pressure ramping rate. For example, the pressurizing gas may be flowed into the second inner volume via the second gas inlet port 115 as discussed above. In some embodiments, the pressurizing gas comprises at least one of nitrogen ($N_2$), hydrogen ($H_2$), argon (Ar), helium (He), or the like. In some embodiments, the second chamber pressure ranges from about 30 to about 600 Torr. In some embodiment, the desired pressure ramping rate ranges from about 30_ to about 150 Torr/sec.

The etch process typically occurs at the second pressure. In some embodiments, the pressure may be ramped (e.g., from the first pressure to the second pressure) by flowing pressurized gases to the second inner volume 105 while flowing etching gases into the first inner volume 103 at the same time (e.g., 508 and 510 occur simultaneously or with overlap). This approach may advantageously improve process throughput. However, since etching only happens when the pressure is above a certain threshold pressure (for example, about 80 Torr, or between about 30 to about 600 Torr), in some embodiments, the second pressure may be ramped up to first with a pressurizing gas (e.g., at 510), then the etching gases may be flowed into the first inner volume 103 for etching (e.g., at 508). Performing 510 prior to 508 as discussed above may provide better process control, however, it also wastes a few seconds (e.g., up to 7 sec) of ramping time with no etching. By flowing etching gases at the same time, some etching will happen during ramping thereby shortening the etch time needed at the stable second chamber pressure. However, most of the etching still happens upon reaching the second chamber pressure. As such, 508 and 510 may occur in either order or with partial or complete overlap.

Figure 6D:
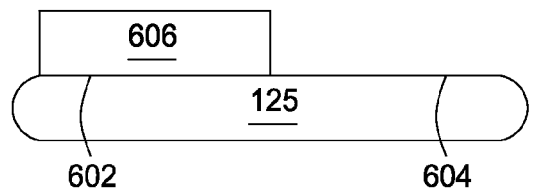

Using the pressurizing gas in combination with the etching gas, the chamber pressure is raised to a suitable chamber pressure to selective etch the second layer 608 as illustrated in FIG. 6D. The deposition and etch processes may be repeated several times, or until an epitaxial layer of desired thickness is deposited on the substrate. For example, after the selective etching process is completed, the chamber pressure may be rapidly decreased for a successive deposition step. As discussed above, by either the absence of a pocket (e.g., substrate support 124A), or by use of a vented pocket (e.g., substrate support 124B, 124C), the substrate 125 remains stable on the substrate support during rapid decrease in chamber pressure for the deposition process.

Thus, methods and apparatus for deposition processes have been disclosed herein. The inventive apparatus may include susceptor designs and/or additional apparatus as disclosed above to advantageously provide rapid pressure equilibration between the frontside and backside of a substrate during processing, such as when switching between deposition and etch processes that use different pressures. The inventive apparatus may further advantageously provide improved temperature uniformity across the substrate. Inventive methods have also been disclosed, and may be utilized with the inventive apparatus, to rapidly ramp pressure while maintaining selectivity, growth rate, and layer quality during deposition.

While the foregoing is directed to embodiments of the present invention, other and further embodiments of the invention may be devised without departing from the basic scope thereof.

The invention claimed is:

1. A substrate support, comprising:
   a susceptor plate having a pocket disposed in an upper surface of the susceptor plate and having a lip formed in the upper surface and circumscribing the pocket, the lip configured to support a substrate on the lip; and
   a plurality of vents extending from the pocket to a location on the upper surface of the susceptor plate radially outward of the lip to exhaust gases trapped between a backside of the substrate and the pocket when a substrate is disposed on the lip.

2. The substrate support of claim 1, wherein the pocket is concave.

3. The substrate support of claim 1, wherein each vent is a groove radially extending from an inner portion of the pocket to beyond the lip of the susceptor plate.

4. The substrate support of claim 1, wherein each vent is a groove radially extending from an inner portion of the pocket to a portion of the lip of the susceptor plate that lies radially beyond where an edge of the substrate would sit when the substrate is disposed on the lip.

5. The substrate support of claim 1, wherein each vent is a hole disposed proximate the lip and having a location and a diameter such that the hole is formed partially in the upper surface of the susceptor plate and partially in the pocket.

6. The substrate support of claim 1, further comprising:
   a central support having a supporting member radially extending from the central support to support the susceptor plate on the supporting member.

7. The substrate support of claim 6, further comprising:

a plurality of lift pin holes disposed through the susceptor plate, between the pocket and a backside of the susceptor plate; and a plurality of lift pins, each lift pin moveably disposed through a respective lift pin hole.

8. The substrate support of claim 7, further comprising:

a plurality of lift pin supporting surfaces, each lift pin supporting surface disposed on the pocket facing side of each lift pin hole and configured to support a lift pin when the lift pin is in a retracted position.

9. The substrate support of claim 8, further comprising:

a substrate lift assembly disposed about the central support and axially moveable along the central support to engage each lift pin to raise or lower a substrate with respect to the susceptor plate.

10. A substrate process chamber, comprising:

a process chamber having the substrate support of claim 1 disposed in an inner volume of the process chamber, wherein the inner volume comprises a first volume disposed above the substrate support and a second volume disposed below the substrate support;

a first gas inlet disposed above the substrate support for providing a process gas to the first volume to process a substrate disposed on the substrate support; and a second gas inlet disposed below the upper surface of the substrate support for providing a pressurizing gas to the second volume to facilitate raising the chamber pressure to a desired chamber pressure at a desired pressure ramping rate.

11. The substrate process chamber of claim 10, further comprising:

a pressure control valve coupled between a gas panel for supplying the process and pressurizing gases and the first and second gas inlets, wherein the pressure control valve regulates the flow of the process and pressurizing gases such that the chamber pressure does not substantially exceed the desired chamber pressure during ramping the pressure at the desired pressure ramping rate.

12. A substrate support, comprising:

a susceptor plate having a pocket disposed in an upper surface of the susceptor plate and having a lip formed in the upper surface and circumscribing the pocket, the lip configured to support a substrate on the lip;

a plurality of lift pin holes disposed through the susceptor plate; and a plurality of vents extending from the pocket to only a backside of the susceptor plate to exhaust gases trapped between the backside of the substrate and the pocket when a substrate is present, wherein the vents are configured such that there is no line of sight from the pocket to the backside of the susceptor plate in a direction parallel to a central axis of the susceptor plate, and wherein the vents are arcuate and disposed between the plurality of lift pin holes.

13. The substrate support of claim 12, wherein each vent is a slot disposed proximate the peripheral edge of the pocket and circumferentially along the peripheral edge.

14. The substrate support of claim 1, wherein each vent extends only partially through the susceptor plate.

15. The substrate support of claim 1, wherein each vent is a groove that radially extends linearly from the pocket to the location on the upper surface of the susceptor plate radially outward of the lip.

16. The substrate support of claim 1, wherein the plurality of vents are three vents equidistantly spaced from one another.

17. The substrate support of claim 12, wherein the plurality of vents are three vents equidistantly spaced from one another.

* * * * *